(12) United States Patent
Kang et al.

(10) Patent No.: US 10,998,464 B2
(45) Date of Patent: May 4, 2021

(54) FLIP-CHIP LIGHT EMITTING DIODE, MANUFACTURING METHOD OF FLIP-CHIP LIGHT EMITTING DIODE AND DISPLAY DEVICE INCLUDING FLIP-CHIP LIGHT EMITTING DIODE

(71) Applicant: SAMSUNG ELECTRONICS CO., LTD., Suwon-si (KR)

(72) Inventors: Jinhee Kang, Suwon-si (KR); Jaephil Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/533,925

(22) Filed: Aug. 7, 2019

(65) Prior Publication Data
US 2020/0052151 A1 Feb. 13, 2020

(30) Foreign Application Priority Data
Aug. 10, 2018 (KR) .......... 10-2018-0093972

(51) Int. Cl.
*H01L 33/00* (2010.01)
*H01L 33/38* (2010.01)
(Continued)

(52) U.S. Cl.
CPC ........ *H01L 33/0037* (2013.01); *H01L 25/167* (2013.01); *H01L 33/0075* (2013.01);
(Continued)

(58) Field of Classification Search
CPC .................................................. H01L 33/0037
See application file for complete search history.

(56) References Cited

U.S. PATENT DOCUMENTS 8,362,514 B2 * 1/2013 Hwang .......... H01L 33/44
257/99
9,159,773 B2 10/2015 Hsu et al.
(Continued)

FOREIGN PATENT DOCUMENTS

CA 2916291 A1 * 6/2017 ............. H01L 33/08
CA 2920715 A1 * 8/2017 ......... H01L 33/0037
(Continued)

OTHER PUBLICATIONS

Written Opinion (PCT/ISA/237) issued by the International Searching Authority in corresponding International Application No. PCT/KR2019/009872, dated Nov. 19, 2019.
(Continued)

*Primary Examiner* — Victoria K. Hall
(74) *Attorney, Agent, or Firm* — Sughrue Mion, PLLC

(57) ABSTRACT

A flip-chip light emitting diode (LED), a display device including at least one flip-chip LED, and a method of manufacturing the LED. The flip-chip LED including a light-emitting layer; an n-type semiconductor layer laminated on a lower part of the light-emitting layer; a p-type semiconductor layer laminated on an upper part of the light-emitting layer; a first electrode that is electrically connected to the n-type semiconductor layer via a first contact hole formed in the LED; a second electrode that is electrically connected to the p-type semiconductor layer, and is electrically insulated from the first electrode; a metal layer provided in a first area, a second area, and a third area; a third electrode that is formed on the metal layer in the third area, is electrically connected to the metal layer, and is electrically insulated from the first electrode and the second electrode; and a plurality of insulating layers.

20 Claims, 22 Drawing Sheets

(51) Int. Cl.
*H01L 33/44* (2010.01)
*H01L 33/40* (2010.01)
*H01L 25/16* (2006.01)
*H01L 33/50* (2010.01)
*H01L 33/32* (2010.01)
*H01L 33/06* (2010.01)

(52) U.S. Cl.
CPC ............ *H01L 33/32* (2013.01); *H01L 33/382* (2013.01); *H01L 33/405* (2013.01); *H01L 33/44* (2013.01); *H01L 33/50* (2013.01); *H01L 33/06* (2013.01); *H01L 2933/0016* (2013.01); *H01L 2933/0025* (2013.01)

(56) References Cited

U.S. PATENT DOCUMENTS

| | | | |
|---|---|---|---|
| 2005/0211989 A1* | 9/2005 | Horio | H01L 33/46 257/79 |
| 2006/0081869 A1 | 4/2006 | Lu et al. | |
| 2013/0256629 A1 | 10/2013 | Lee et al. | |
| 2014/0291666 A1 | 10/2014 | Tsang | |
| 2014/0374714 A1 | 12/2014 | Hsu et al. | |
| 2017/0098740 A1* | 4/2017 | Ohmae | H01L 33/30 |
| 2017/0186907 A1* | 6/2017 | Chaji | H01L 33/62 |
| 2017/0229430 A1 | 8/2017 | Lai et al. | |
| 2018/0062047 A1* | 3/2018 | Biwa | H05B 47/16 |
| 2019/0115491 A1* | 4/2019 | Furuta | G03G 15/04054 |
| 2019/0288156 A1* | 9/2019 | Chaji | H01L 33/0037 |
| 2020/0044117 A1* | 2/2020 | Vierheilig | H01L 33/42 |
| 2020/0350477 A1* | 11/2020 | Shim | H01L 25/0753 |

FOREIGN PATENT DOCUMENTS

| | | | | |
|---|---|---|---|---|
| CA | 2986412 A1 * | 5/2019 | ......... | H01L 33/0037 |
| CA | 2987165 A1 * | 5/2019 | ............ | H01L 33/44 |
| CN | 102097477 A | 6/2011 | | |
| EP | 1237203 A2 | 9/2002 | | |
| JP | 2015-5753 A | 1/2015 | | |
| WO | 2017142315 A1 | 8/2017 | | |

OTHER PUBLICATIONS

International Search Report (PCT/ISA/210), issued by International Searching Authority in corresponding International Application No. PCT/KR2019/009872, dated Nov. 19, 2019.

* cited by examiner

110

53  51  52  54

FLIP-CHIP LIGHT EMITTING DIODE, MANUFACTURING METHOD OF FLIP-CHIP LIGHT EMITTING DIODE AND DISPLAY DEVICE INCLUDING FLIP-CHIP LIGHT EMITTING DIODE

CROSS-REFERENCE TO RELATED APPLICATION

This application is based on and claims priority under 35 U.S.C. § 119(a) to Korean Patent Application No. 10-2018-0093972, filed on Aug. 10, 2018 in the Korean Intellectual Property Office, the disclosure of which is incorporated by reference herein in its entirety.

BACKGROUND

1. Field

Some embodiments of the disclosure relate to a flip-chip LED, a manufacturing method of a flip-chip LED, and a display device including a flip-chip LED, and more particularly, to a flip-chip LED to which an MIS structure is applied so that leakage currents inside an LED can be reduced and a manufacturing method thereof, and a display device that can improve efficiency of a manufacturing process by including such an LED.

2. Description of Related Art

In the field of light emitting diodes (LEDs), a metal-insulator-semiconductor (MIS) structure for reducing leakage currents that may be generated inside an LED is generally being applied on the premise of a vertical type LED.

However, in the case of a vertical type LED, limitations are being pointed out which are that, according to electrode structures that are formed in the upper and lower parts of an element, there is a limitation in the aspect of efficiency of a forming process of electrode layers and a transfer process of forming electrical connectors, and also, efficiency of a manufacturing process in manufacturing a middle or large sized display is low, etc.

In contrast, in the case of a flip-chip LED, it not only has a structure that is advantageous for miniaturization, weight lightening, and high integration of a single element, but it can also improve light emission efficiency and efficiency of a transfer process, etc. in manufacturing a display device. Thus, a flip-chip LED is generally being applied in the field of micro LEDs.

SUMMARY

In view of the above, a need for a flip-chip LED has risen, wherein an MIS structure is applied to the flip-chip LED, and which can thereby make it possible that the aforementioned advantage of a flip-chip LED is utilized, and at the same time, an effect of reduction of leakage currents is secured, and further, the degree of utilization of an element and efficiency of a manufacturing process in manufacturing a display device are improved.

Some embodiments of the disclosure address the aforementioned problem, and provide a flip-chip LED which is capable of reducing leakage currents that may be generated inside an LED, and at the same time, improve the degree of utilization of an element and efficiency of a manufacturing process in manufacturing a display device and a manufacturing method thereof. Some embodiments of the disclosure also provide a display device that includes such an LED.

According to an embodiment of the disclosure for achieving the aforementioned purpose, a flip-chip light emitting diode (LED) includes a light-emitting layer, an n-type semiconductor layer and a p-type semiconductor layer that are respectively laminated on an upper part and a lower part of the light-emitting layer, a first electrode that is electrically connected to the n-type semiconductor layer, a second electrode that is electrically connected to the p-type semiconductor layer, and is electrically distinguished from the first electrode, a first contact hole that is formed such that the first electrode can be electrically connected to the n-type semiconductor layer, metal layers provided in a first area surrounding an outer contour surface of the LED, a second area wherein the first contact hole is formed, and a third area distinguished from areas wherein the first electrode and the second electrode are formed, a third electrode that is formed on a metal layer in the third area and is electrically connected to the metal layer, and is electrically distinguished from the first electrode and the second electrode, and a plurality of insulating layers that are provided on the upper and lower parts of the metal layers such that the metal layers can be electrically distinguished from the first electrode and the second electrode.

The LED may further include a second contact hole formed on the insulating layer and a reflective layer provided on the p-type semiconductor layer, and the second electrode may be electrically connected to the p-type semiconductor layer through the second contact hole and the reflective layer.

The LED may further include a fourth electrode, and the metal layers may be provided in a first area surrounding an outer contour surface of the LED, a second area wherein the first contact hole is formed, a third area distinguished from areas wherein the first electrode and the second electrode are formed, and a fourth area distinguished from areas wherein the first electrode, the second electrode, and the third electrode are formed. The fourth electrode may be formed on the metal layer in the fourth area and may be electrically connected to the metal layer, and may be electrically distinguished from the first electrode and the second electrode.

According to an embodiment of the disclosure, a manufacturing method of a flip-chip light emitting diode (LED) includes the steps of depositing a light-emitting layer, and an n-type semiconductor layer and a p-type semiconductor layer that are respectively laminated on an upper part and a lower part of the light-emitting layer on a substrate, forming a plurality of light-emitting cells including the light-emitting layer, the n-type semiconductor layer, and the p-type semiconductor layer by etching the light-emitting layer, the n-type semiconductor layer, and the p-type semiconductor layer, with respect to each of the plurality of light-emitting cells, forming a first contact hole in each of the light-emitting cells by etching the light-emitting layer, the n-type semiconductor layer, and the p-type semiconductor layer, with respect to each of the plurality of light-emitting cells, depositing a first insulating layer on areas wherein etching was performed in the step of forming the plurality of light-emitting cells and on areas wherein etching was performed in the step of forming the first contact hole, with respect to each of the plurality of light-emitting cells, depositing metal layers on a first area surrounding the outer contour surfaces of the plurality of light-emitting cells, a second area wherein the first contact hole is formed, and a third area on one side among the upper areas of the first insulating layer, with respect to each of the plurality of light-emitting cells, depositing a second insulating layer on an area wherein the first contact hole is formed, with respect to each of the plurality of light-emitting cells, forming a second contact hole in another side surface area distinguished from areas wherein the metal layers are deposited among the upper areas of the first insulating layer, and forming a first electrode in the area wherein the first contact hole is formed, forming a second electrode in the area wherein the second contact hole is formed, and forming a third electrode in the third area wherein the metal layer is deposited.

The manufacturing method of an LED may further include the step of depositing a reflective layer on the deposited p-type semiconductor layer, and in the step of forming the first contact hole, with respect to each of the plurality of light-emitting cells, a first contact hole may be formed in each of the light-emitting cells by etching the light-emitting layer, the n-type semiconductor layer, the p-type semiconductor layer, and the reflective layer.

According to an embodiment of the disclosure, a display device includes a plurality of flip-chip light emitting diodes (LEDs), a plurality of driving electrodes, a display panel including a driving substrate, and a processor for controlling the display panel.

Also, at least one LED among the plurality of LEDs includes a light-emitting layer, an n-type semiconductor layer and a p-type semiconductor layer that are respectively laminated on an upper part and lower part of the light-emitting layer, a first electrode that is electrically connected to the n-type semiconductor layer, a second electrode that is electrically connected to the p-type semiconductor layer, and is electrically distinguished from the first electrode, a first contact hole that is formed such that the first electrode can be electrically connected to the n-type semiconductor layer, metal layers provided in a first area surrounding an outer contour surface of the LED, a second area wherein the first contact hole is formed, and a third area distinguished from areas wherein the first electrode and the second electrode are formed, a third electrode that is formed on the metal layer in the third area and is electrically connected to the metal layer, and is electrically distinguished from the first electrode and the second electrode, and a plurality of insulating layers that are provided on the upper and lower parts of the metal layers such that the metal layer can be electrically distinguished from the first electrode and the second electrode.

At least one LED among the plurality of LEDs may further include a second contact hole formed on the insulating layer and a reflective layer provided on the p-type semiconductor layer, and the second electrode may be electrically connected to the p-type semiconductor layer through the second contact hole and the reflective layer.

At least one LED among the plurality of LEDs may further include a fourth electrode, and the metal layers may be provided in a first area surrounding an outer contour surface of the LED, a second area wherein the first contact hole is formed, a third area distinguished from areas wherein the first electrode and the second electrode are formed, and a fourth area distinguished from areas wherein the first electrode, the second electrode, and the third electrode are formed, and the fourth electrode may be formed on the metal layer in the fourth area and may be electrically connected to the metal layer, and may be electrically distinguished from the first electrode and the second electrode.

The driving substrate may include a plurality of switching elements, and each of the plurality of switching elements may be individually connected to each of the first electrode, the second electrode, and the third electrode through the plurality of driving electrodes, and the processor may independently control application of voltages to the first electrode, the second electrode, and the third electrode through the plurality of switching elements.

A third electrode included in a first element among the plurality of LEDs, and a third electrode included in a second element adjacent to the first element may be electrically connected to the driving substrate through the same driving electrode.

In the display panel, a third electrode included in a first element among the plurality of LEDs and a third electrode included in a second element adjacent to the first element may be joined with each other.

The display panel may further include a plurality of phosphors provided on the upper parts of the plurality of LEDs and a plurality of light-leakage blocking films provided among the plurality of phosphors, and light-emitting areas of each of the plurality of LEDs may be distinguished in parallel through the plurality of light-leakage blocking films.

The plurality of phosphors may comprise quantum dots (QDs).

In an embodiment of the disclosure, a flip-chip light emitting diode (LED) comprises a light-emitting layer; an n-type semiconductor layer laminated on a lower part of the light-emitting layer; a p-type semiconductor layer laminated on an upper part of the light-emitting layer; a first electrode that is electrically connected to the n-type semiconductor layer via a first contact hole formed in the LED; a second electrode that is electrically connected to the p-type semiconductor layer, and is electrically insulated from the first electrode; a metal layer provided in a first area surrounding an outer contour surface of the LED, a second area where the first contact hole is formed, and a third area separate from areas where the first electrode and the second electrode are formed; a third electrode that is formed on the metal layer in the third area, is electrically connected to the metal layer, and is electrically insulated from the first electrode and the second electrode; and a plurality of insulating layers that are provided on upper and lower parts of the metal layer such that the metal layer is electrically insulated from the first electrode and the second electrode.

In an embodiment of the disclosure, a manufacturing method of a flip-chip light emitting diode (LED) comprises depositing a light-emitting layer, a p-type semiconductor layer, and an n-type semiconductor layer on a substrate, the p-type semiconductor layer and the n-type semiconductor layer being respectively laminated on an upper part and a lower part of the light-emitting layer; forming a plurality of light-emitting cells, each including the light-emitting layer, the n-type semiconductor layer, and the p-type semiconductor layer, by etching the light-emitting layer, the n-type semiconductor layer, and the p-type semiconductor layer; forming, with respect to each of the plurality of light-emitting cells, a first contact hole in the light emitting cell by etching the light-emitting layer, the n-type semiconductor layer, and the p-type semiconductor layer; depositing, with respect to each of the plurality of light-emitting cells, a first insulating layer on areas wherein etching was performed in the step of forming the plurality of light-emitting cells and on areas wherein etching was performed in the step of forming the first contact hole; depositing, with respect to each of the plurality of light-emitting cells, a metal layer on a first area surrounding an outer contour surface of the light-emitting cell, a second area where the first contact hole is formed, and a third area on one side among upper areas of the first insulating layer; depositing, with respect to each of the plurality of light-emitting cells, a second insulating layer on the second area where the first contact hole is formed; forming, with respect to each of the plurality of light-emitting cells, a second contact hole in another side surface area separate from areas where the metal layer is deposited among the upper areas of the first insulating layer; and forming, with respect to each of the plurality of light-emitting cells, a first electrode in the first contact hole, forming a second electrode in the second contact hole, and forming a third electrode in the third area where the metal layer is deposited.

In an embodiment of the disclosure, a display device comprises a plurality of light emitting diodes (LEDs); a plurality of driving electrodes; a display panel including a driving substrate; and a processor configured to control the display panel. At least one LED among the plurality of LEDs is a flip-chip LED comprising a light-emitting layer; an n-type semiconductor layer laminated on a lower part of the light-emitting layer; a p-type semiconductor layer laminated on an upper part of the light-emitting layer; a first electrode that is electrically connected to the n-type semiconductor layer via a first contact hole formed in the LED; a second electrode that is electrically connected to the p-type semiconductor layer, and is electrically insulated from the first electrode; a metal layer provided in a first area surrounding an outer contour surface of the flip-chip LED, a second area where the first contact hole is formed, and a third area separate from areas where the first electrode and the second electrode are formed; a third electrode that is formed on the metal layer in the third area, is electrically connected to the metal layer, and is electrically insulated from the first electrode and the second electrode; and a plurality of insulating layers that are provided on upper and lower parts of the metal layer such that the metal layer is electrically insulated from the first electrode and the second electrode.

DETAILED DESCRIPTION

Figure 1A:
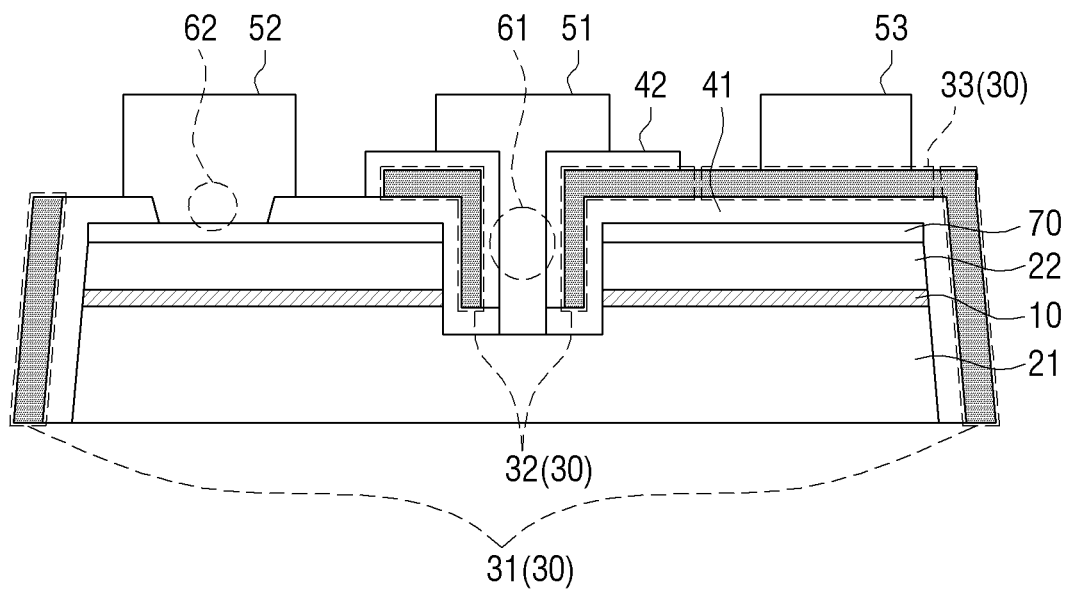
FIG. 1A is a sectional view of an LED according to an embodiment of the disclosure.

Various modifications may be made to the embodiments of the disclosure, and there may be various types of embodiments. Accordingly, some non-limiting example embodiments will be illustrated in drawings, and the embodiments will be described in detail in the detailed description. However, it should be noted that the various embodiments are not for limiting the scope of the disclosure to a specific embodiment, but they should be interpreted to include various modifications, equivalents, and/or alternatives of the embodiments of the disclosure. Also, with respect to the detailed description of the drawings, similar components may be designated by similar reference numerals.

Meanwhile, in explaining the disclosure, in case it is determined that detailed explanation of related known functions or features may unnecessarily confuse the gist of the disclosure, the detailed explanation will be omitted.

In addition, the embodiments below may be modified in various different forms, and the scope of the technical idea of the disclosure is not limited to the embodiments below. Rather, these embodiments are provided to make the disclosure more sufficient and complete, and to fully convey the technical idea of the disclosure to those skilled in the art.

Terms used in the disclosure are just used to describe specific embodiments, and are not intended to limit the scope of protection of the disclosure. Also, singular expressions may include plural expressions, unless defined differently in the context.

In the disclosure, expressions such as "have," "may have," "include" and "may include" should be construed as denoting that there are such characteristics (e.g., elements such as numerical values, functions, operations and components), and the expressions are not intended to exclude the existence of additional characteristics.

Also, in the disclosure, the expressions "A or B," "at least one of A and/or B," or "one or more of A and/or B" and the like may include all possible combinations of the listed items. For example, "A or B," "at least one of A and B" or "at least one of A or B" refer to all of the following cases: (1) including at least one A, (2) including at least one B or (3) including at least one A and at least one B.

Further, the expressions "first," "second" and the like used in the disclosure may be used to describe various elements regardless of any order and/or degree of importance. Also, such expressions are used only to distinguish one element from another element, and are not intended to limit the elements.

Also, the description in the disclosure that one element (e.g., a first element) is "(operatively or communicatively) coupled with/to" or "connected to" another element (e.g., a second element) should be interpreted to include both the case where the one element is directly coupled to the another element, and the case where the one element is coupled to the another element through still another element (e.g., a third element). In contrast, the description that one element (e.g., a first element) is "directly coupled" or "directly connected" to another element (e.g., a second element) can be interpreted to mean that still another element (e.g., a third element) does not exist between the one element and the another element.

In addition, the expression "configured to" used in the disclosure may be interchangeably used with other expressions such as "suitable for," "having the capacity to," "designed to," "adapted to," "made to" and "capable of," depending on cases. Meanwhile, the term "configured to" does not necessarily mean that a device is "specifically designed to" in terms of hardware.

Instead, under some circumstances, the expression "a device configured to" may mean that the device "is capable of" performing an operation together with another device or component. For example, the phrase "a processor configured to perform A, B and C" may mean a dedicated processor (e.g., an embedded processor) for performing the corresponding operations, or a generic-purpose processor (e.g., a central processing unit (CPU) or an application processor) that can perform the corresponding operations by executing one or more software programs stored in a memory device.

Hereinafter, embodiments of the disclosure will be described in detail with reference to the accompanying drawings.

Hereinafter, embodiments of the disclosure will be described in detail with reference to the accompanying drawings to the extent that those having ordinary skill in the art to which the disclosure belongs can easily carry out the embodiments. However, the disclosure may be implemented in various different forms, and are not limited to the embodiments described herein.

Also, in the drawings, parts that are not related to explanation were omitted, for explaining the disclosure clearly, and throughout the specification, similar components were designated by similar reference numerals.

Figure 1B:
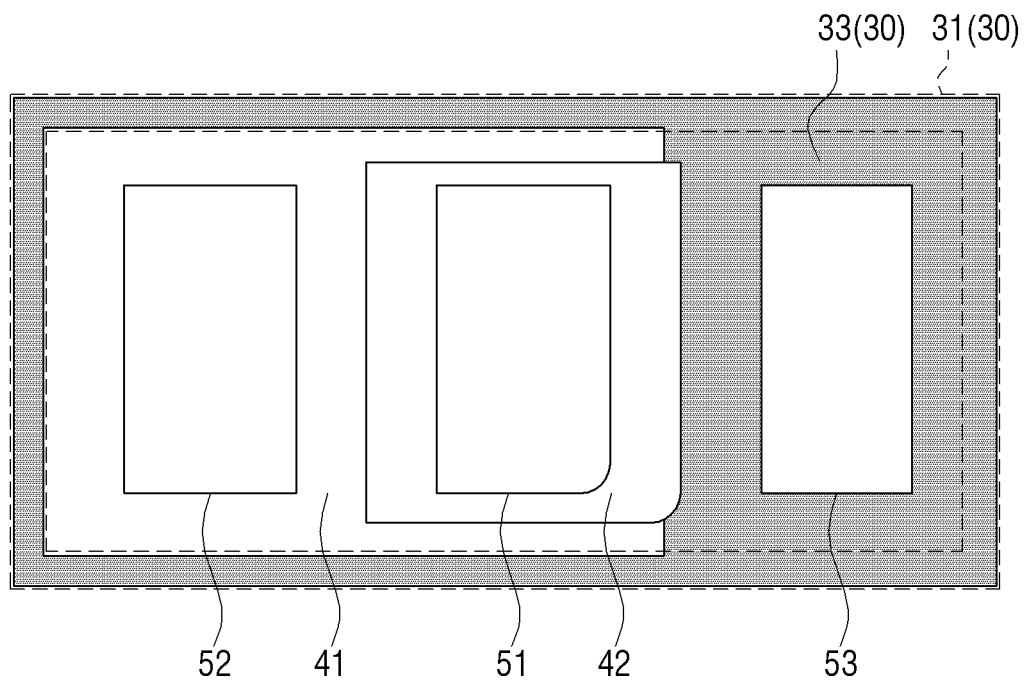
FIG. 1B is a plan view of an LED according to an embodiment of the disclosure.

FIGS. 1A and 1B are a sectional view and a plan view, respectively, for illustrating an LED according to an embodiment of the disclosure.

As illustrated in FIGS. 1A and 1B, an LED 111 according to an embodiment of the disclosure includes a light-emitting layer 10, an n-type semiconductor layer 21, a p-type semiconductor layer 22, a first electrode 51, a second electrode 52, a third electrode 53, a first contact hole 61, a metal layer 30, and a plurality of insulating layers 41, 42.

Hereinafter, for the convenience of explanation, the n-type semiconductor layer 21 and the p-type semiconductor layer 22 will be referred to as a plurality of conductive semiconductor layers 21, 22 when they are referred to integrally.

The plurality of conductive semiconductor layers 21, 22 may be implemented as semiconductors of compounds of Group III-V, Group II-VI, etc. Specifically, the plurality of conductive semiconductor layers 21, 22 may be implemented as nitride semiconductor layers, and in particular, GaN semiconductor layers. However, the plurality of conductive semiconductor layers 21, 22 according to the disclosure are not limited thereto, and they may consist of various materials according to various characteristics required for the LED 111.

The plurality of conductive semiconductor layers 21, 22 include an n-type semiconductor layer 21 and a p-type semiconductor layer 22. Here, an n-type semiconductor is a semiconductor wherein free electrons are used as carriers carrying electric charges, and it may be manufactured by doping n-type dopants like Si, Ge, Sn, and Te. Meanwhile, a p-type semiconductor is a semiconductor wherein holes are used as carriers carrying electric charges, and it may be manufactured by doping p-type dopants like Mg, Zn, Ca, and Ba.

As it will be described layer, as a light-emitting layer 10 is laminated between the n-type semiconductor layer 21 and the p-type semiconductor layer 22, the light-emitting layer 10 becomes capable of emitting light.

The light-emitting layer 10 is located between the n-type semiconductor layer 21 and the p-type semiconductor layer 22, and is a layer wherein electrons which are carriers of the n-type semiconductor layer 21 and holes which are carriers of the p-type semiconductor layer 22 meet. When electrons and holes meet at the light-emitting layer 10, a potential barrier is formed as the electrons and the holes are recombined. In addition, when the electrons and the holes cross over the potential barrier according to the applied voltage and are transferred to a low energy level, light having a wavelength corresponding thereto is generated.

The light-emitting layer 10 may have a structure of a multi-quantum well (MQW), but the disclosure is not limited thereto, and the light-emitting layer 10 may have various structures such as a quantum dot (QD) structure.

In case the light-emitting layer 10 is formed in a multi-quantum well structure, the well layer/the barrier layer of the light-emitting layer 10 may be formed in structures like InGaN/GaN, InGaN/InGaN and GaAs(InGaGs)/AlGaAs, but the disclosure is not limited to such structures.

The materials and the thickness of the light-emitting layer 10 may be selected in various ways, and light having different wavelengths may be emitted in accordance thereto.

The LED 111 according to the disclosure is implemented as a structure in the form of a flip-chip, as a first electrode 51 and a second electrode 52 electrically connected to the plurality of conductive semiconductor layers 21, 22, and a third electrode 53 electrically connected to a reflective layer 70 are arranged on the same surface. Here, the feature that the first electrode 51, the second electrode 52, and the third electrode 53 are arranged on the same surface means that all of the electrodes are arranged in the upper part of the LED 111 based on the LED 111 as illustrated in FIG. 1, but it should not be interpreted in a limited way that one surface of each of the first electrode 51, the second electrode 52, and the third electrode 53 should necessarily be formed on the same layer. The first electrode 51 is electrically connected to the n-type semiconductor layer 21 among the plurality of conductive semiconductor layers 21, 22. Specifically, a first contact hole 61 may be formed in an area penetrating the light-emitting layer 10 and the plurality of conductive semiconductor layers 21, 22, and the first electrode 51 may be electrically connected to the n-type semiconductor layer 21 through the first contact hole 61.

The second electrode 52 is electrically connected to the p-type semiconductor layer 22 among the plurality of conductive semiconductor layers 21, 22. Specifically, the second electrode 52 may be electrically connected to the p-type semiconductor layer 22 through a reflective layer 70 and a second contact hole 62 that will be described below.

The metal layer 30 can perform the role of increasing the light emission efficiency of the LED 111 as the reflective layer 70 that will be described below, and can also make it possible that leakage currents generated in the LED 111 due to application of a voltage through a third electrode 53 that will be described below is reduced.

Specifically, the metal layer 30 may be provided in a first area 31 surrounding an outer contour surface of the LED 111, a second area 32 wherein the first contact hole 61 is formed, and a third area 33 distinguished, e.g., separate or distinct, from areas wherein the first electrode 51 and the second electrode 52 are formed. The metal layer 30 may be a single metal layer that is provided in the first area 31, the second area 32, and the third area 33, or the metal layer 30 may be a plurality of metal layers, including respective metal layers in the first area 31, the second area 32, and the third area 33.

Here, the first area 31 and the second area 32 are areas wherein leakage currents may be generated in the LED 111, and are areas that can cover surfaces wherein the light-emitting layer 10 is exposed according to an etching process that will be described below. Meanwhile, on the metal layer 30 in the third area 33, a third electrode 53 is formed.

That is, the third electrode 53 is formed on the metal layer 30 in the third area 33 distinguished from areas wherein the first electrode 51 and the second electrode 52 are formed, and are electrically insulated from the first electrode 51 and the second electrode 52. Also, the third electrode 53 is electrically connected to the metal layer 30 and performs a role as a gate electrode. The third electrode 53 as described above is electrically connected to a driving substrate of a display device as will be described below, and accordingly, the processor of the display device may apply a gate voltage to the third electrode 53.

The plurality of insulating layers 41, 42 may be provided on the upper and lower parts of the metal layer 30 such that the metal layer 30 can be electrically insulated from the first electrode 51 and the second electrode 52. For the insulating layers 41, 42 as described above, silicon dioxide ($SiO_2$) may be used mainly, but the insulating layers 41, 42 according to the disclosure are not limited to a specific material.

Through the insulating layers 41, 42, a second contact hole 62 may be formed, and the second contact hole 62 performs the role of a passage that makes the second electrode 52 electrically connected to the p-type semiconductor layer 22 through the reflective layer 70.

The LED 111 according to an embodiment of the disclosure may further include a reflective layer 70. The reflective layer 70 can perform the role of increasing the light emission efficiency of the LED 111 by reflecting light proceeded to the reflective layer 70 and emitting the light to a light-emitting area, and can also perform the role of electrically connecting the second electrode 52 to the p-type semiconductor layer 22 as described above.

Specifically, the reflective layer 70 may be provided on the p-type semiconductor layer 22, and also, it may be provided in the first area 31 surrounding an outer contour surface of the LED 111 and the second area 32 wherein the first contact hole 61 is formed.

For the reflective layer 70 as described above, various metal materials having high reflectivity and also high electrical conductivity like aluminum (Al) may be used, but the reflective layer 70 according to the disclosure is not limited to specific materials.

As described above, the LED 111 may comprise the first electrode 51, formed in the center part of the LED 111, and the second electrode 52 and the third electrode 53, respectively formed on both sides with the first electrode 51 as the center. However, the disclosure is not necessarily limited to this.

For example, within a range for achieving an aspect of the disclosure, it is possible that the LED 111 is implemented as a structure wherein the second electrode 52 is formed in the center part of the LED 111 and the first electrode 51 and the third electrode 53 are respectively formed on both sides with the second electrode 52 as the center. The LED 111 may also be implemented in various other structures.

The shape and the size of each of the first electrode 51, the second electrode 52, and the third electrode 53 can be selected in various ways according to a specific structure of the LED 111.

According to an embodiment of the disclosure as described above, the flip-chip LED 111 may comprise a metal-insulator-semiconductor (MIS) structure including a third electrode 53, insulating layers 41, 42, and metal layer 30.

Accordingly, leakage currents that may be generated inside the LED 111 can be reduced effectively. Specifically, when a voltage is applied to the third electrode 53, currents flow through the metal layer 30, and accordingly, in an area wherein leakage currents may be generated inside the LED 111, e.g., the first area 31 surrounding an outer contour surface of the LED 111 and the second area 32 wherein the first contact hole 61 is formed, electrons or holes are not accumulated. Thus, leakage currents can be reduced effectively.

In addition, in the case of the flip-chip LED 111 as described above, the degree of utilization of an element and efficiency of a manufacturing process in manufacturing a display device can be improved. Also, an effective method of connecting the LED 111 and a driving substrate (backplane) can be provided, and further, there is an advantage for miniaturization, weight lightening, and high integration of an element.

Accordingly, the flip-chip LED 111 as described above can be utilized widely particularly in the field of micro LEDs. Specifically, a micro LED may be a super small size LED having a size of from 10 μm to 100 μm. Thus, the micro LED is advantageous for miniaturization and high integration of an element as described above. Also, the flip-chip LED 111 having high efficiency of a manufacturing process can be easily applied to the field of micro LEDs.

Thus, in case the structure of the LED 111 according to the disclosure is implemented as a micro LED, an LED having high resolution, high light emission efficiency, a fast reaction speed, low power consumption, high luminance, a long lifespan, etc. in addition to the various effects of the disclosure as described above can be provided.

Figure 2A:
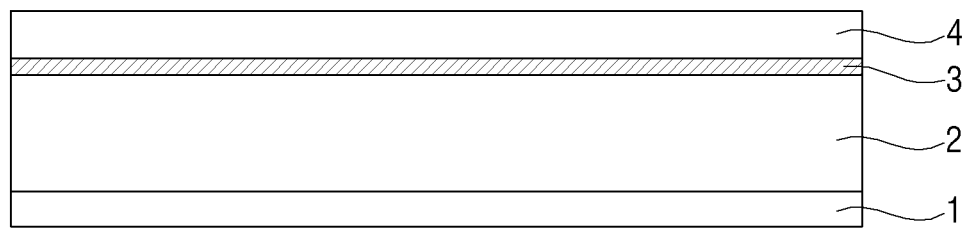
FIG. 2A is a diagram for illustrating a step of a manufacturing method of an LED according to an embodiment of the disclosure.
Figure 2B:
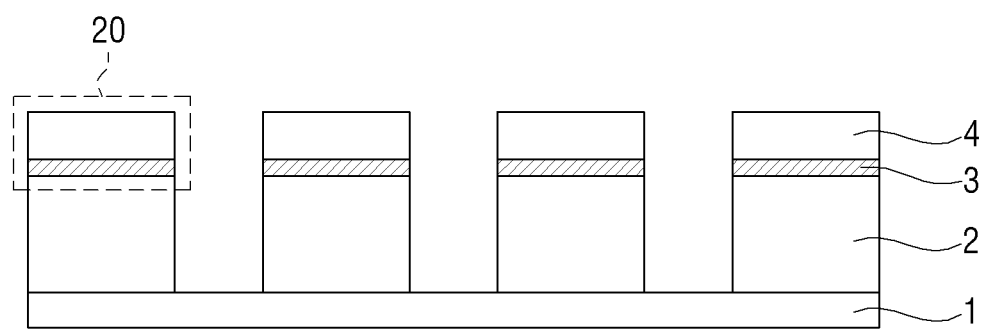
FIG. 2B is a diagram for illustrating a step of a manufacturing method of an LED according to an embodiment of the disclosure.
Figure 2C:
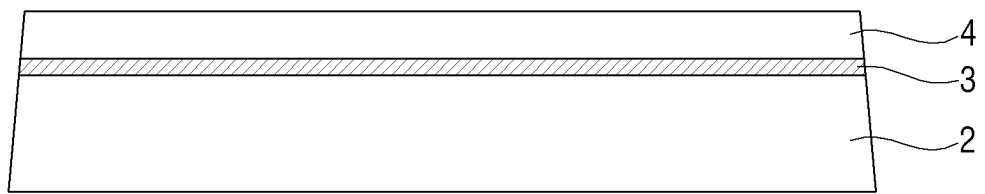
FIG. 2C is a diagram for illustrating a step of a manufacturing method of an LED according to an embodiment of the disclosure.
Figure 2D:
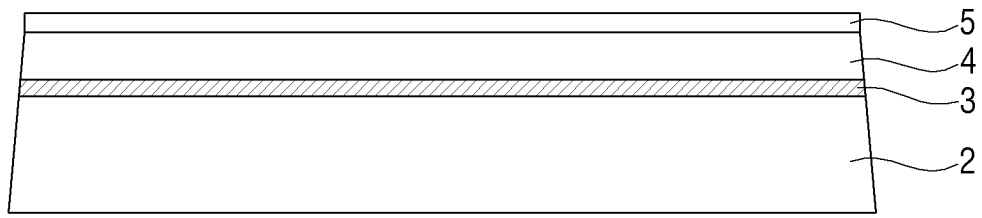
FIG. 2D is a diagram for illustrating a step of a manufacturing method of an LED according to an embodiment of the disclosure.
Figure 2E:
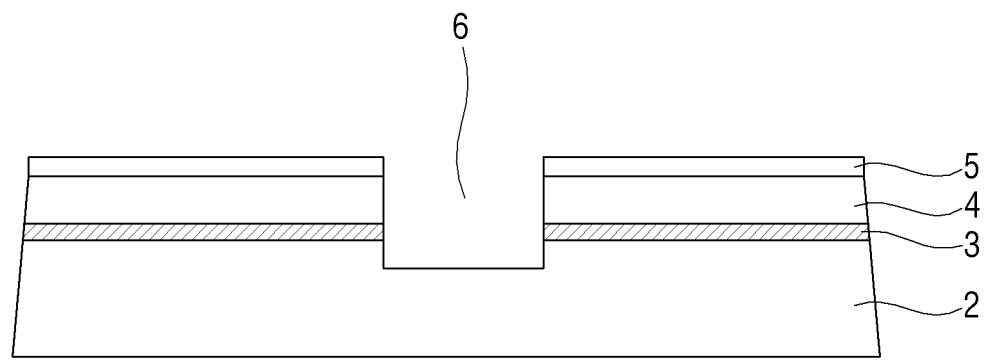
FIG. 2E is a diagram for illustrating a step of a manufacturing method of an LED according to an embodiment of the disclosure.
Figure 2F:
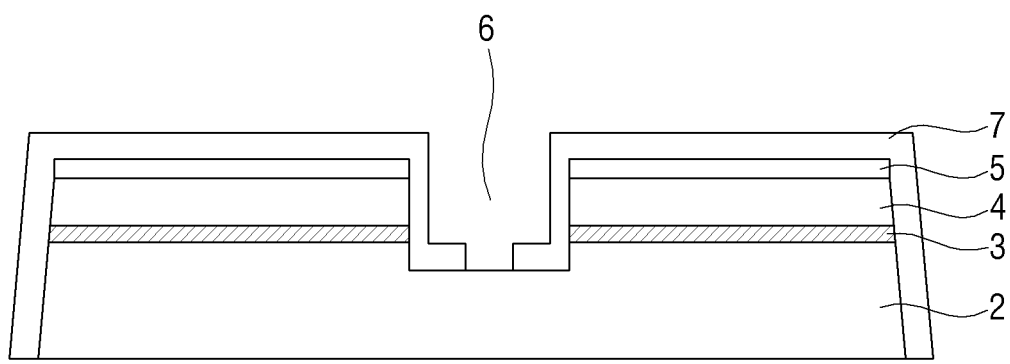
FIG. 2F is a diagram for illustrating a step of a manufacturing method of an LED according to an embodiment of the disclosure.
Figure 2G:
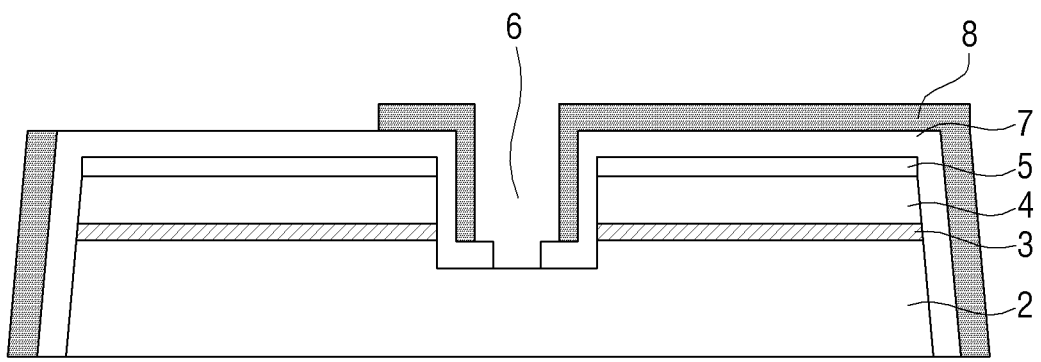
FIG. 2G is a diagram for illustrating a step of a manufacturing method of an LED according to an embodiment of the disclosure.
Figure 2H:
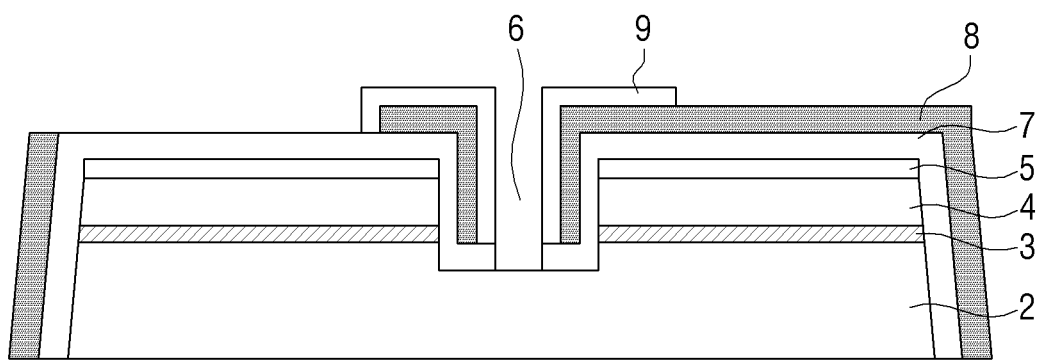
FIG. 2H is a diagram for illustrating a step of a manufacturing method of an LED according to an embodiment of the disclosure.
Figure 2I:
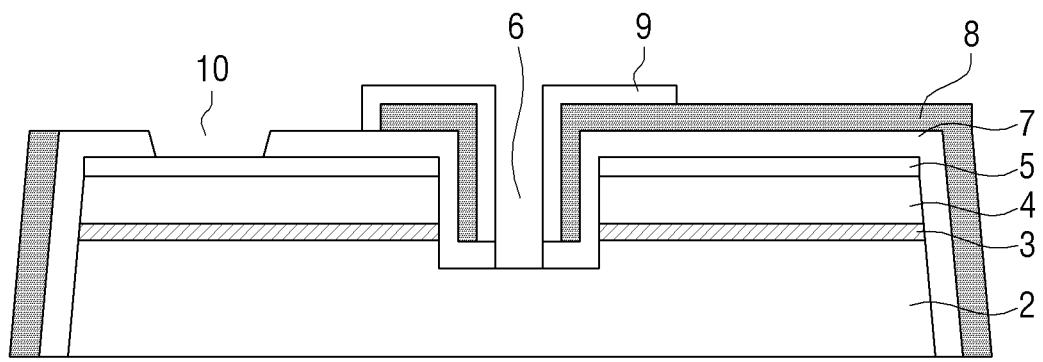
FIG. 2I is a diagram for illustrating a step of a manufacturing method of an LED according to an embodiment of the disclosure.
Figure 2J:
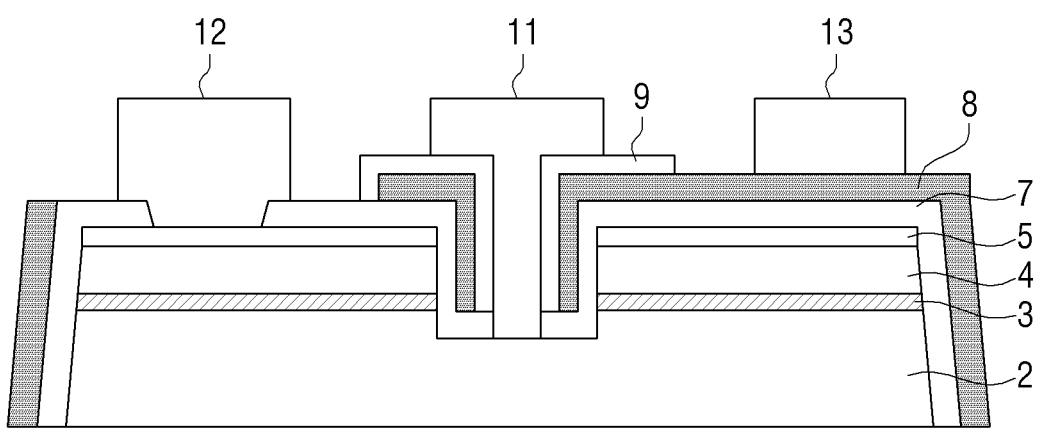
FIG. 2J is a diagram for illustrating a step of a manufacturing method of an LED according to an embodiment of the disclosure.
Figure 3:
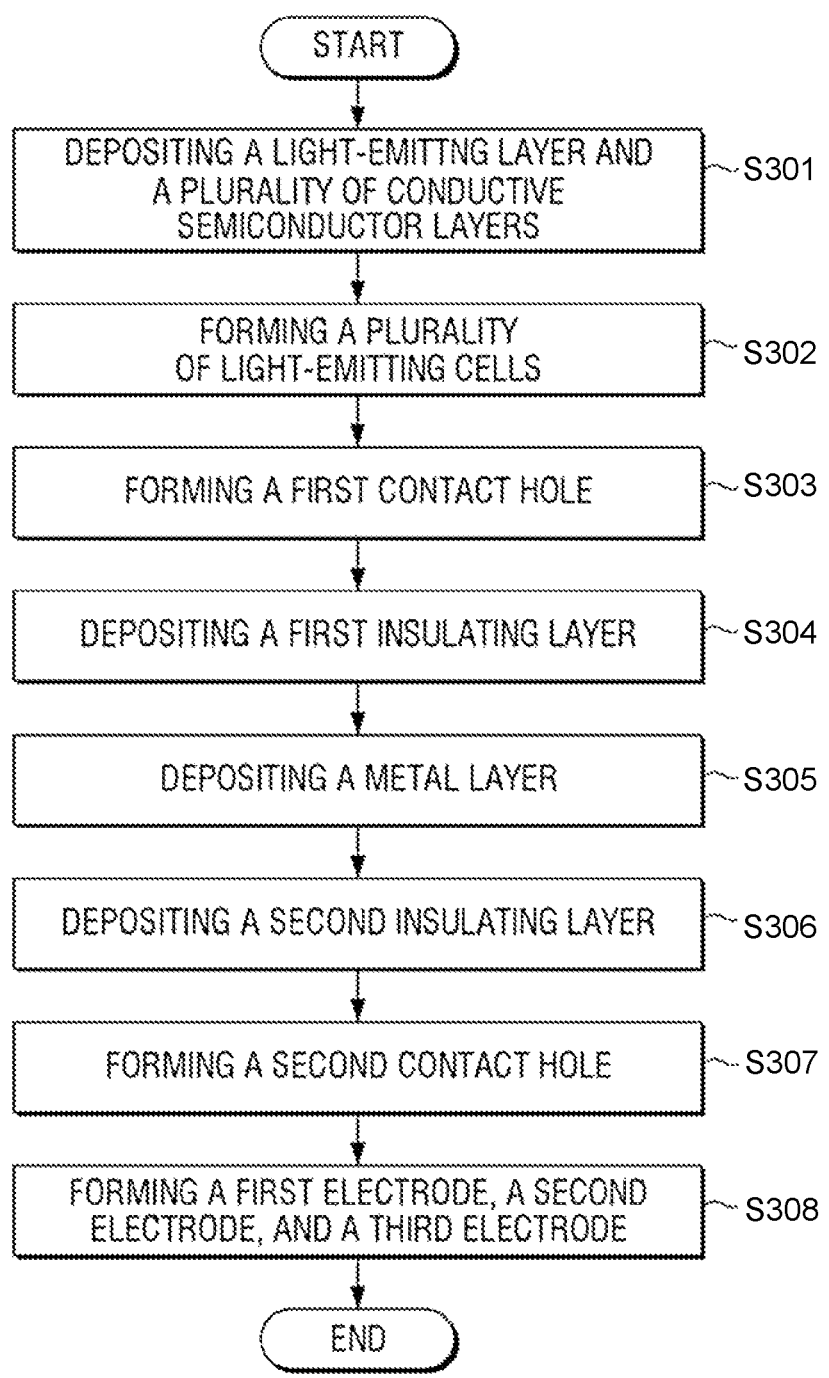
FIG. 3 is a flow chart for sequentially describing the steps of a manufacturing method as illustrated in FIGS. 2A to 2J.

FIGS. 2A to 2J are diagrams for sequentially illustrating each step of a manufacturing method of an LED according to an embodiment of the disclosure, and FIG. 3 is a flow chart for sequentially illustrating each step of a manufacturing method as illustrated in FIGS. 2A to 2J.

Hereinafter, the disclosure will be described with reference to FIGS. 2A to 2J together with FIG. 3. Meanwhile, in FIGS. 2A to 2J, reference numerals in the drawings differ from those in FIGS. 1A and 1B, to effectively describe the laminated structure wherein layers are sequentially formed according to a manufacturing method of a light-emitting element.

A structure of the LED according to an embodiment of the disclosure and the characteristics of each layer included in the LED, etc. were described in the explanation for FIGS. 1A and 1B above. Accordingly, overlapping descriptions will be omitted, except for clearly describing the embodiments according to the disclosure.

A substrate 1 used for a manufacturing method of an LED according to an embodiment of the disclosure may be materials appropriate for growth of a semiconductor material or a carrier wafer, and the like. Specifically, the substrate 1 may consist of materials such as sapphire ($Al_2SO_4$), SiC, GaN, GaAs, and ZnO, but the substrate 1 used in the disclosure is not limited to specific materials.

When the substrate 1 is provided, a light-emitting layer 3, and a plurality of conductive semiconductor layers 2, 4 laminated on the upper and lower parts of the light-emitting layer 3 are deposited on the substrate 1 at operation S301, as illustrated in FIG. 2A. Specifically, an n-type semiconductor layer 2 is deposited on the substrate 1, and the light-emitting layer 3 is deposited on the upper part of the deposited n-type semiconductor layer 2, and a p-type semiconductor layer 4 is deposited on the upper part of the deposited light-emitting layer 3.

Also, within a range for achieving an aspect of the disclosure, it is possible that various conductive semiconductor layers such as an n+-type semiconductor layer and a p+-type semiconductor layer may be additionally deposited on the upper or lower parts of the n-type semiconductor layer 2 and the p-type semiconductor layer 4.

Deposition as described above may be performed by using a process technology such as metal organic chemical vapor deposition (MOCVD) or molecular beam epitaxy (MBE), and such a process technology may also be applied in a deposition process that will be described below.

When the light-emitting layer 3 and the plurality of conductive semiconductor layers 2, 4 are deposited, a plurality of light-emitting cells including the light-emitting layer 3 and the plurality of conductive semiconductor layers 2, 4 may be formed by etching the light-emitting layer 3 and the plurality of conductive semiconductor layers 2, 4 at operation S302, as illustrated in FIG. 2B.

Meanwhile, formation of light-emitting cells may be performed through photolithography and etching processes, and such process technologies may also be applied in an etching process that will be described below.

With respect to each of a plurality of light-emitting cells formed as described above, a plurality of LEDs according to an embodiment of the disclosure may be manufactured through subsequent manufacturing processes that will be described below. Accordingly, hereinafter, manufacturing processes performed with respect to each of a plurality of light-emitting cells will be explained, and for the convenience of explanation, in FIGS. 2C to 2J, an upper area 20 of one light-emitting cell among the plurality of light-emitting cells formed is illustrated in an enlarged form.

That is, FIG. 2C is a drawing that enlarged an upper area 20 of a light-emitting cell as illustrated in FIG. 2B, as described above.

When a plurality of light-emitting cells are formed, with respect to each of the plurality of light-emitting cells, a reflective layer 5 may be deposited on the p-type semiconductor layer 4 among the plurality of conductive semiconductor layers 2, 4 deposited, as illustrated in FIG. 2D.

Meanwhile, a reflective layer 5 does not have to be necessarily provided for achieving the purpose of the disclosure. However, hereinafter, subsequent manufacturing processes will be explained on the premise that a step of depositing a reflective layer 5 was performed.

When the reflective layer 5 is deposited, with respect to each of the plurality of light-emitting cells, the light-emitting layer 3, the plurality of conductive semiconductor layers 2, 4, and the reflective layer 5 are etched, and a first contact hole 6 may be formed in each light-emitting cell at operation S303, as illustrated in FIG. 2E.

When the first contact hole 6 is formed, with respect to each of the plurality of light-emitting cells, a first insulating layer 7 may be deposited on an area wherein etching was performed in the step of forming a plurality of light-emitting cells and an area wherein etching was performed in the step of forming the first contact hole 6 at operation S304, as illustrated in FIG. 2F.

When the first insulating layer 7 is deposited, with respect to each of the plurality of light-emitting cells, a metal layer 8 may be deposited on a first area surrounding the outer contour surfaces of the plurality of light-emitting cells, a second area wherein the first contact hole 6 is formed, and a third area on one side among the upper areas of the first insulating layer 7 at operation S305, as illustrated in FIG. 2G.

Specifically, the first area and the second area are areas wherein leakage currents may be generated in the LED, and are areas that can cover surfaces wherein the light-emitting layer 10 is exposed according to an etching process as described above. Meanwhile, as will be described below, a third electrode 13 is formed on the metal layer 8 in the third area.

When the metal layer 8 is deposited, with respect to each of the plurality of light-emitting cells, a second insulating layer 9 may be deposited on an area wherein the first contact hole 6 is formed at operation S306, as illustrated in FIG. 2H.

When the second insulating layer 9 is deposited, with respect to each of the plurality of light-emitting cells, a second contact hole 10 may be formed in another side surface area distinguished from an area wherein the metal layer 8 is deposited among the upper areas of the first insulating layer 7 at operation S307, as illustrated in FIG. 2I.

When the second contact hole 10 is formed, a first electrode 11 may be formed in the area wherein the first contact hole 6 is formed, a second electrode 12 may be formed in the area wherein the second contact hole 10 is formed, and a third electrode 13 may be formed in the third area wherein the metal layer 8 is deposited at operation S308, as illustrated in FIG. 2J.

According to the manufacturing method as described above, an LED as illustrated in FIGS. 1A and 1B may be ultimately manufactured.

As described above, a manufacturing method of an LED according to an embodiment of the disclosure has been explained sequentially. However, the disclosure is not necessarily limited to the aforementioned order. For example, within a range for achieving an aspect of the disclosure, the temporal order among each step of the manufacturing method as described above can be changed.

Also, in the case of steps of depositing or forming a plurality of components that are equivalent to one another such as the steps of forming the first electrode 11, the second electrode 12, and the third electrode 13, the steps may be performed in any order and any number of the steps may be sequentially or simultaneously performed.

Figure 4A:
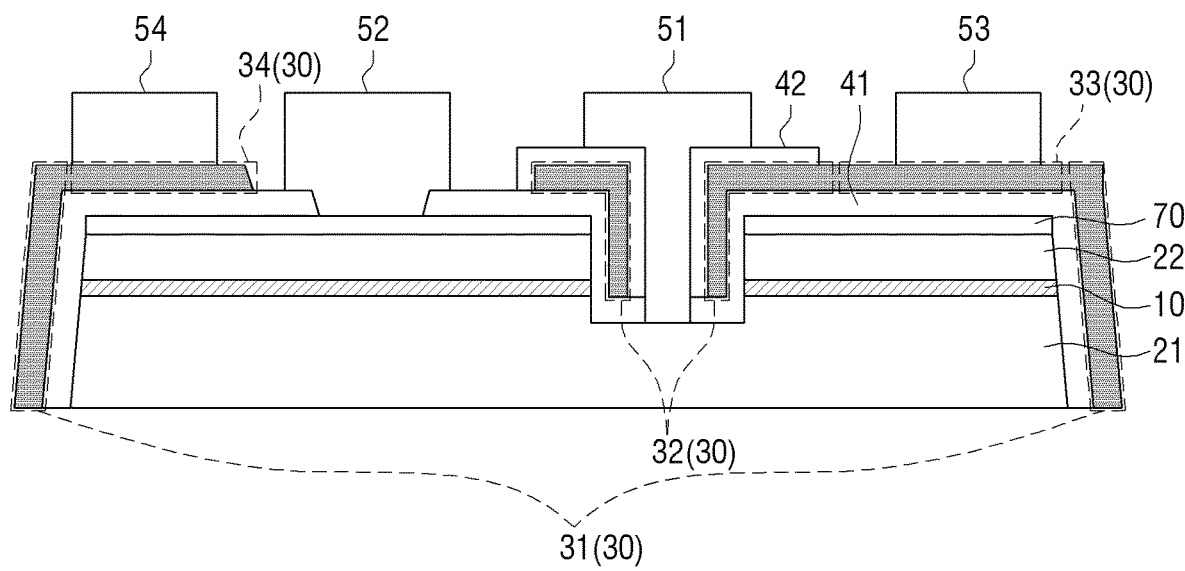
FIG. 4A is a sectional view of an LED that includes a fourth electrode according to an embodiment of the disclosure.
Figure 4B:
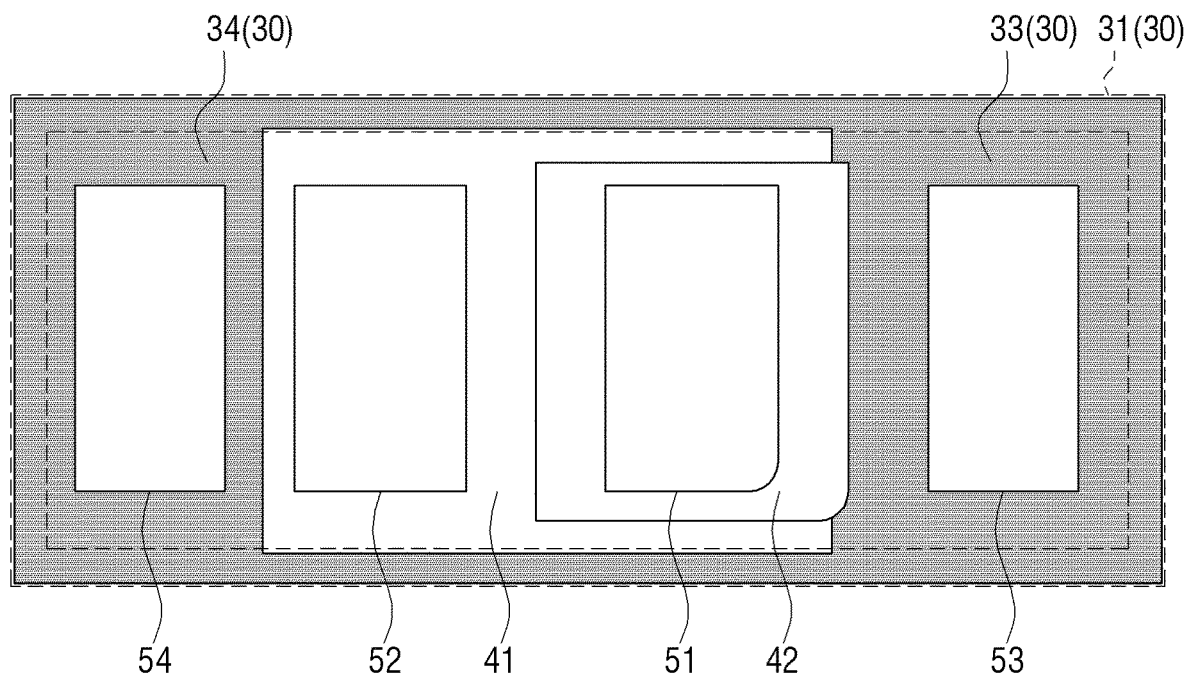
FIG. 4B is a plan view of an LED that further includes a fourth electrode according to an embodiment of the disclosure.

FIGS. 4A and 4B are a sectional view and a plan view, respectively for illustrating an LED further including a fourth electrode according to an embodiment of the disclosure.

As described above, embodiments wherein leakage currents can be reduced where the third electrode 53 is connected to a metal layer and performs a role as a gate electrode have been explained. However, the number of electrodes that can perform a role as the third electrode 53 is not necessarily limited to one.

For example, as illustrated in FIGS. 4A and 4B, the LED 211 according to an embodiment of the disclosure may include the components described in the explanation for FIGS. 1A to 3 above, and may further include a fourth electrode 54. Additionally, the metal layer 30 may also be provided in a fourth area 34 in the lower part of the fourth electrode 54, and may be electrically connected to the fourth electrode 54.

Specifically, the metal layer 30 according to an embodiment of the disclosure may be provided in a first area 31 surrounding an outer contour surface of the LED 111, a second area 32 wherein the first contact hole is formed, a third area 33 distinguished from areas wherein the first electrode 51 and the second electrode 52 are formed, and a fourth area 34 distinguished from areas wherein the first electrode 51, the second electrode 52, and the third electrode 53 are formed.

As described in FIG. 1A and the explanation for FIG. 1A above, the first area 31 and the second area 32 are areas wherein leakage currents may be generated in the LED 111, and are areas that can cover surfaces wherein the light-emitting layer 10 is exposed according to an etching process as described above. Meanwhile, on the metal layer 30 in the third area 33, a third electrode 53 may be formed, and on the metal layer 30 in the fourth area 34, a fourth electrode 54 may be formed.

That is, the fourth electrode 54 is formed on the metal layer 30 in the fourth area 34 distinguished from areas wherein the first electrode 51, the second electrode 52, and the third electrode 53 are formed, and is electrically insulated from the first electrode 51 and the second electrode 52. Also, the fourth electrode 54 is electrically connected to a metal layer like the third electrode 53, and performs a role as a gate electrode that makes currents flow in the metal layer through the applied voltage.

In other words, according to an embodiment of the disclosure, the third electrode 53 and also the fourth electrode 54 may perform a role as a gate electrode. Accordingly, compared to a case wherein a voltage is applied only to the third electrode 53, voltage drop due to resistance can be reduced, and accordingly, leakage currents that may be generated inside the LED 111 can be reduced more effectively.

As described above, in the disclosure, the number of electrodes that can perform a role as the third electrode 53 is not necessarily limited to one. That is, the number of electrodes that can perform a role as a gate electrode may be changed according to the design and the structure of a driving substrate of a display device.

Further, in order to satisfy an effect of controlling leakage currents, an effective driving condition, or electrical connection with a driving substrate, the number and the shapes of the first electrode 51, the second electrode 52, and the electrodes 53, 54 that can perform a role as a gate electrode may be changed in various ways.

As described above, an LED 111 and a manufacturing method thereof according to various embodiments of the disclosure may be provided. Hereinafter, a display device including an LED 111 as described above will be explained.

Figure 5:
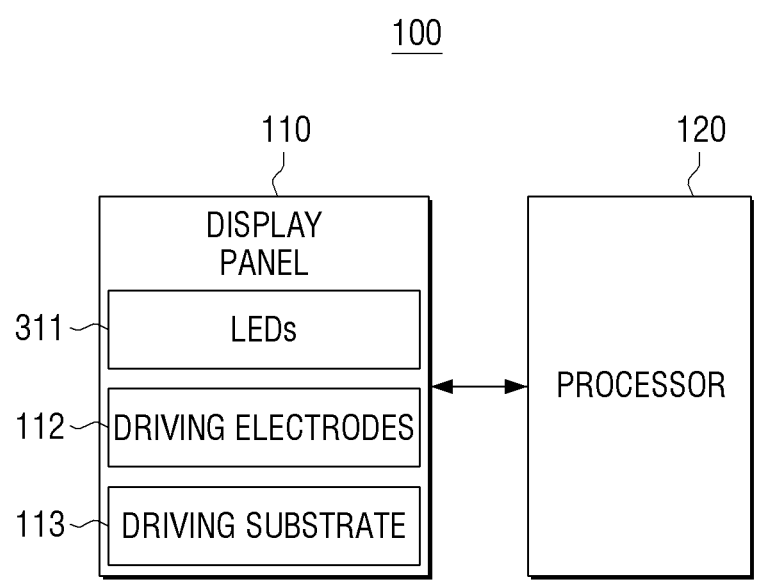
FIG. 5 is a block diagram for schematically illustrating a configuration of a display device according to an embodiment of the disclosure.

FIG. 5 is a block diagram for schematically illustrating a configuration of a display device according to an embodiment of the disclosure.

As illustrated in FIG. 5, a display device 100 according to an embodiment of the disclosure includes a display panel 110 and a processor 120. Also, the display panel 110 includes a plurality of LEDs 311, a plurality of driving electrodes 112 and a driving substrate 113. Meanwhile, although not illustrated specifically, a driving substrate may include a driving circuit (not shown) and a plurality of switching elements (not shown).

At least one LED among the plurality of LEDs 311 may be an LED 111 as described in the explanation for FIGS. 1A to 4B above. That is, at least one LED among the plurality of LEDs 311 may be a flip-chip LED 111 to which an MIS structure is applied in a form as described above. Accordingly, hereinafter, descriptions will be made with reference to both FIG. 1A and FIG. 1B.

For example, at least one LED 111 among the plurality of LEDs 311 includes a light-emitting layer 10, a plurality of conductive semiconductor layers 21, 22 that are laminated on the upper and lower parts of the light-emitting layer, a first electrode 51 that is electrically connected to an n-type semiconductor layer 21 among the plurality of conductive semiconductor layers 21, 22, a second electrode 52 that is electrically connected to a p-type semiconductor layer 22 among the plurality of conductive semiconductor layers 21, 22, and is electrically insulated from the first electrode 51, and a first contact hole 61 that is formed such that the first electrode can be electrically connected to the n-type semiconductor layer 21.

Also, at least one LED 111 among the plurality of LEDs 311 includes a metal layer 30 provided in a first area 31 surrounding an outer contour surface of the LED 111, a second area 32 wherein the first contact hole is formed, and a third area 33 distinguished from areas wherein the first electrode 51 and the second electrode 52 are formed, a third electrode 53 that is formed on the metal layer 30 in the third area 33 and is electrically connected to the metal layer 30, and is electrically insulated from the first electrode 51 and the second electrode 52, and a plurality of insulating layers 41, 42 that are provided on the upper and lower parts of the metal layer 30 such that the metal layer 30 can be electrically insulated from the first electrode 51 and the second electrode 52.

The plurality of driving electrodes 112 perform the role of electrically connecting the first electrode 51, the second electrode 52, and the third electrode 53 included in each of the plurality of LEDs 311 to the driving substrate 113. For example, the first electrode 51, the second electrode 52, and the third electrode 53 included in each of the plurality of LEDs 111 may be connected to the plurality of driving electrodes 112 through a bump and indium tin oxide (ITO) as will be described below. Accordingly, the first electrode, the second electrode, and the third electrode included in each of the plurality of LEDs 311 may be electrically connected to the driving substrate 113.

The driving substrate 113 may include a driving circuit (not shown) and a plurality of switching elements (not shown). The switching elements (not shown) are semiconductor elements that are constituted such that it can control driving of at least one of the plurality of LEDs 311 included in the display panel 110, and perform the role of a kind of switch with respect to individual pixels of the display device 100. As such switching elements (not shown), a thin film transistor (TFT) can be used.

For example, each of the plurality of switching elements (not shown) according to an embodiment of the disclosure may be individually connected to each of the first electrode 51, the second electrode 52, and the third electrode 53 through the plurality of driving electrodes 112 as described above.

The processor 120 controls the overall operations of the display device 100. Such a processor 120 may be implemented in various ways. For example, the processor 120 may be implemented as at least one of an application specific integrated circuit (ASIC), an embedded processor, a microprocessor, a hardware control logic, a hardware finite state machine (FSM), or a digital signal processor (DSP).

Also, the processor may include a ROM, a RAM, a graphic processing unit (GPU), a CPU, and a bus, and the ROM, the RAM, the graphic processing unit (GPU), the CPU, etc. may be connected with one another through the bus.

In embodiments of the disclosure, the processor may independently control the driving of the plurality of LEDs 311 through the first electrode 51 the second electrode 52, and the third electrode 53.

As described above, at least one LED of the plurality of LEDs according to the disclosure includes the first electrode 51, the second electrode 52, and the third electrode 53, and the first electrode 51, the second electrode 52, and the third electrode 53 are electrically insulated from one another. Also, each of the plurality of switching elements (not shown) according to the disclosure may be individually connected to each of the first electrode 51, the second electrode 52, and the third electrode 53 through the plurality of driving electrodes 112.

Accordingly, the processor may control each of the plurality of switching elements (not shown) individually connected to the first electrode 51, the second electrode 52, and the third electrode 53, and thereby independently control voltages applied to the first electrode 51, the second electrode 52, and the third electrode 53.

Hereinafter, various embodiments regarding the display device 100 according to the disclosure, and in particular, the display panel 110 included in the display device 100 will be described in detail.

Figure 6A:
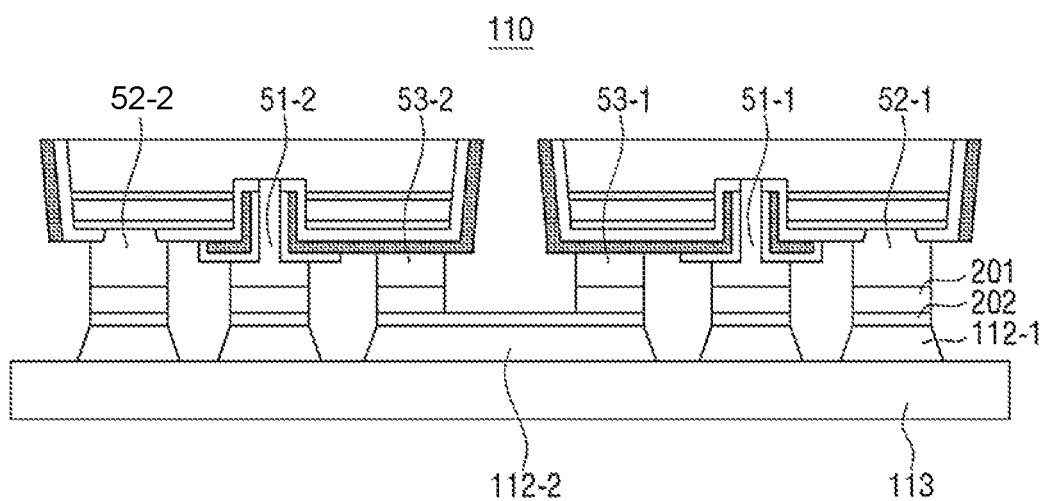
FIG. 6A is a sectional view of a portion of a display panel according to an embodiment of the disclosure.
Figure 6B:
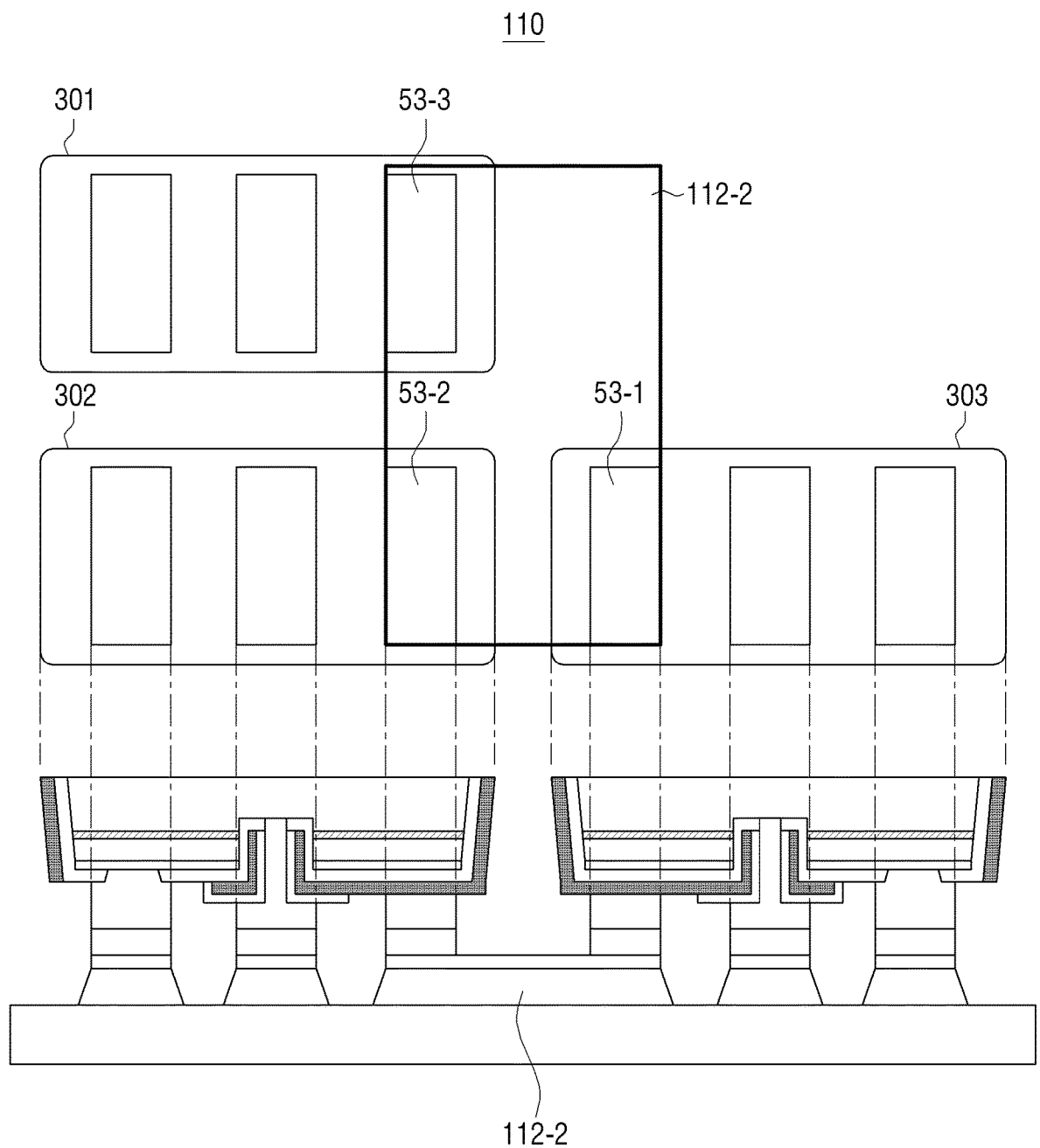
FIG. 6B is a diagram for illustrating a configuration of a pixel in a display panel according to FIG. 6A.
Figure 7:
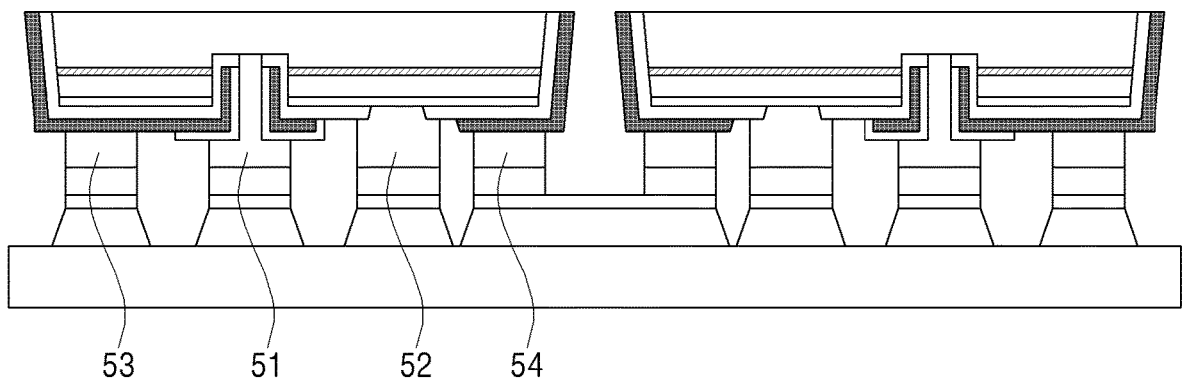
FIG. 7 is a sectional view of a portion of a display panel according to another embodiment of the disclosure.

FIG. 6A is a sectional view for illustrating a portion of a display panel according to an embodiment of the disclosure, FIG. 6B is a diagram for illustrating a configuration of a pixel in a display panel according to FIG. 6A, and FIG. 7 is a sectional view for illustrating a portion of a display panel according to another embodiment of the disclosure.

As described above, the plurality of LEDs 311 according to an embodiment of the disclosure may be connected to the driving substrate 113 through a plurality of driving electrodes.

For example, the first electrodes 51-1, 51-2, the second electrodes 52-1, 52-2, and the third electrodes 53-1, 53-2 included in each of the plurality of LEDs 311 may be electrically connected to the driving substrate 113 through the plurality of driving electrodes 112-1, 112-2. More specifically, the first electrodes 51-1, 51-2, the second electrodes 52-1, 52-2, and the third electrodes 53-1, 53-2 included in each of the plurality of LEDs 311 may be individually connected to each of the plurality of switching elements (not shown) included in the driving substrate 113.

As illustrated in FIG. 6A, the first electrodes 51-1, 51-2, the second electrodes 52-1, 52-2, and the third electrodes 53-1, 53-2 included in each of the plurality of LEDs 311 may be connected to the plurality of driving electrodes 112-1, 112-2 through a bump 201 and indium tin oxide (ITO) 202. However, there is no specific limitation in a bonding method according to the disclosure.

As illustrated in FIG. 6A, the third electrode 53-1 included in a first element among the plurality of LEDs 311, and the third electrode 53-2 included in a second element adjacent to the first element may be electrically connected to the driving substrate 113 through the same driving electrode 112-2.

Further, as illustrated in FIG. 6B, the third electrodes 53-1, 53-2, 53-3 included in LEDs 111 adjacent to one another among the plurality of LEDs 311 may be implemented such that they can be applied voltages through the common driving electrode 112-2.

Specifically, in achieving an aspect of the disclosure, there is no problem even if the same voltage is applied to each of the plurality of third electrodes 53-1, 53-2, 53-3. Accordingly, an individual driving electrode 112-1 with respect to each of the plurality of third electrodes 53-1, 53-2, 53-3 may not necessarily be formed on the driving substrate 113.

Thus, driving electrodes may be formed such that the third electrode 53-1 included in a first element 303 among the plurality of LEDs 311, the third electrode 53-2 included in a second element 302 adjacent to the first element 303 may be electrically connected to the driving substrate 113, and a third electrode 53-3 included in a third element 301 adjacent to the second element 302 through the same driving electrode 112-2. Accordingly, efficiency of a manufacturing process of a display panel 110 can be secured.

Meanwhile, the display panel 110 according to an embodiment of the disclosure may constitute pixels in a form as illustrated in FIG. 6B. That is, each LED 311 may respectively constitute a red sub-pixel, a green sub-pixel, and a blue sub-pixel, and accordingly, a pixel including a red sub-pixel, a green sub-pixel, and a blue sub-pixel may be constituted.

In particular, in the case of constituting pixels in a form as illustrated in FIG. 6B, if driving electrodes are formed such that the third electrodes 53-1, 53-2, 53-3 adjacent to one another are electrically connected to the same driving electrode 112-2, efficiency of a manufacturing process of a display panel 110 as described above can be further improved.

As described above, an embodiment may include a plurality of LEDs 311, wherein at least one LED is an LED 111, as described in the explanation for FIGS. 1A to 3 above, connected to the driving substrate 113 through a plurality of driving electrodes. However, according to another embodiment of the disclosure, the LED connected to the driving substrate 113 through a plurality of driving electrodes 112-1, 112-2 may be an LED 211 as described in the explanation for FIGS. 4A and 4B above. Thus, hereinafter, descriptions will be made with reference to both FIG. 4A and FIG. 4B.

That is, as illustrated in FIG. 7, at least one LED 211 among the plurality of LEDs 311 included in the display panel 110 according to the disclosure may further include a fourth electrode 54. Also, at least one metal layer may be provided in a first area 31 surrounding an outer contour surface of the LED 111, a second area 32 wherein the first contact hole 61 is formed, a third area 33 distinguished from areas wherein the first electrode 51 and the second electrode 52 are formed, and a fourth area 34 distinguished from areas wherein the first electrode 51, the second electrode 52, and the third electrode 53 are formed. In addition, the fourth electrode 54 may be formed on the metal layer 30 in the fourth area 34 and may be electrically connected to the metal layer 30, and may be electrically insulated from the first electrode 51 and the second electrode 52.

According to the display panel 110 as illustrated in FIG. 7, compared to a display panel 110 including an LED 111 wherein only a third electrode 53 performs a role as a gate electrode, the contact area between an LED 211 and a driving substrate can be maximized.

Further, as described in the explanation for FIG. 4A above, voltage drop due to resistance can be reduced, and accordingly, leakage currents that may be generated inside the LED 311 can be reduced more effectively.

As described above, the LED 311 as illustrated in FIGS. 6A and 6B was described in the explanation of LED 111 for FIGS. 1A to 3 above, and also, the LED 311 as illustrated in FIG. 7 was described in more detail in the explanation of LED 211 for FIGS. 4A to 4B above. Thus, overlapping descriptions were omitted, except for clearly describing the embodiments according to the disclosure.

Figure 8:
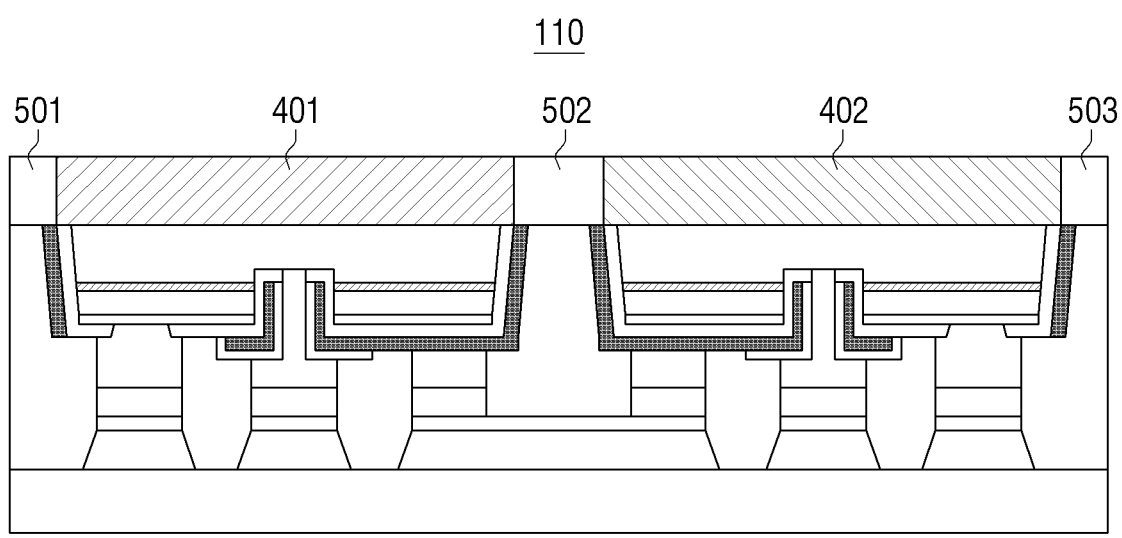
FIG. 8 is a sectional view of a portion of a display panel including phosphors and light-leakage blocking films according to an embodiment of the disclosure.

FIG. 8 is a sectional view for illustrating a portion of a display panel including phosphors and light-leakage blocking films according to an embodiment of the disclosure.

As illustrated in FIG. 8, a display panel according to an embodiment of the disclosure may further include a plurality of phosphors 401, 402 and a plurality of light-leakage blocking films (black matrices) 501, 502, 503.

The plurality of phosphors 401, 402 may be provided on the upper parts of the plurality of LEDs 311. Also, the plurality of phosphors 401, 402 perform the role of absorbing light emitted from the LED 311, and changing the absorbed light to light having a different wavelength, and emitting the light. For example, if blue light emitted from a blue LED 311 and light in a different color emitted by a phosphor excited by the blue light are combined, another color other than blue can be emitted.

In an embodiment, the plurality of phosphors 401, 402 may comprise quantum dots (QDs). For example, quantum dots are small single crystals having a diameter of from 2 nm to 10 nm in a size of from 15 to 150 atoms, and by virtue of their unique quantum dot characteristics, they may create a narrow primary color on a spectrum having a full width at half maximum (FWHM) of from 30 nm to 54 nm, and thus a wide color gamut can be provided.

The plurality of light-leakage blocking films 501, 502, 503 may be provided among the plurality of phosphors. Also, the plurality of light-leakage blocking films 501, 502, 503 perform the role of dividing the light-emitting area of each of the plurality of LEDs 111 in parallel. Accordingly, a phenomenon wherein light generates interference among light-emitting areas of each of the LEDs 311 can be minimized.

Meanwhile, the LEDs 311 as illustrated in FIG. 8 may be implemented as blue LEDs. Also, on the upper part of each of the LEDs 311, a red phosphor 401 and a green phosphor 402 may be provided, and they may respectively emit light in a red shade and light in a green shade. Also, although not illustrated in FIG. 8, an upper part of a specific LED 311 may not include a phosphor, and the blue LEDs 311 may emit light in blue shade through this.

Figure 9A:
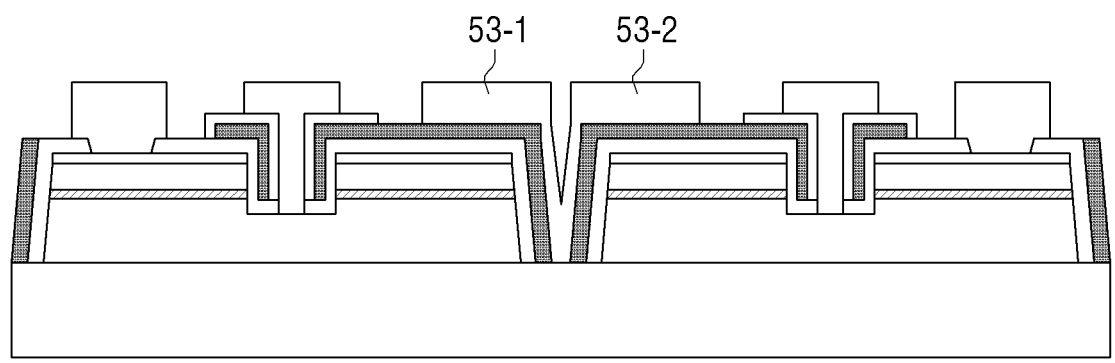
FIG. 9A is a sectional view of a portion of a display panel wherein third electrodes included in each adjacent LED are joined with each other according to an embodiment of the disclosure.
Figure 9B:
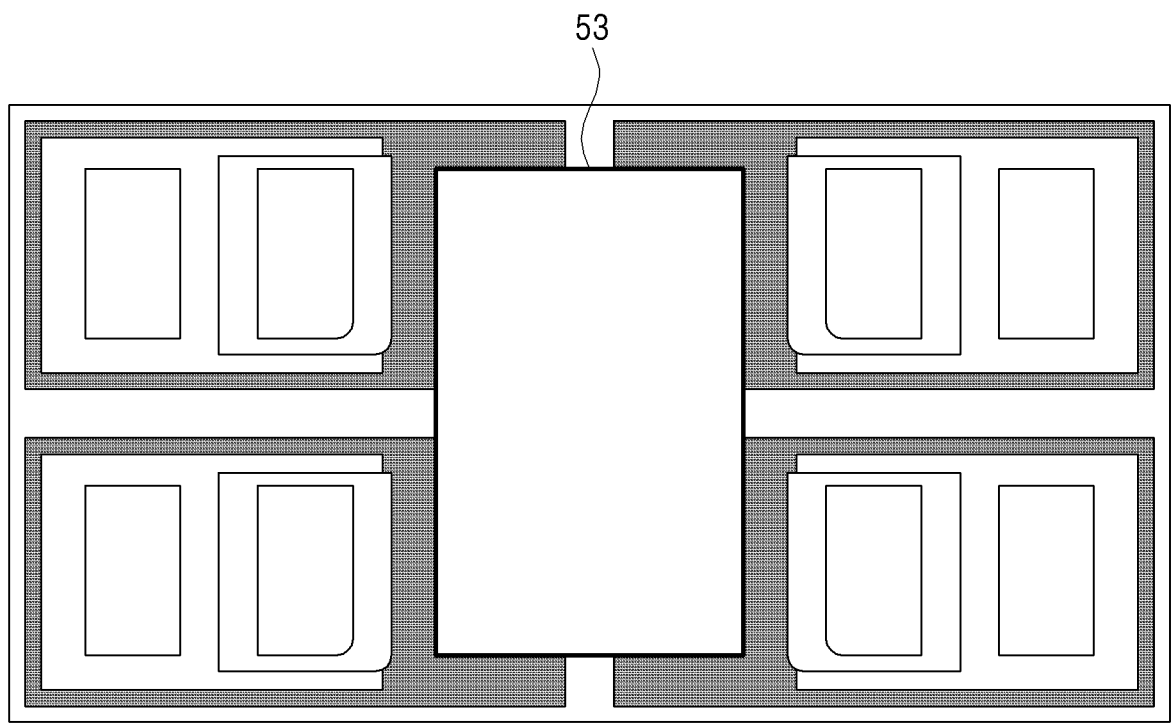
FIG. 9B is a plan view of a display panel wherein third electrodes included in each adjacent LED are joined with each other according to an embodiment of the disclosure.

FIGS. 9A and 9B are a sectional view and a plan view for illustrating a portion of a display panel wherein third electrodes included in each adjacent LED are joined with each other according to an embodiment of the disclosure.

As illustrated in FIGS. 9A and 9B, a display panel according to an embodiment of the disclosure may be implemented in a form wherein a third electrode 53-1 included in a first element among the plurality of LEDs 311 and a third electrode 53-2 included in a second element adjacent to the first element are joined with each other.

In particular, as illustrated in FIG. 9B, in case four adjacent LEDs 311 constitute one pixel, if the embodiment is implemented in a form 53 wherein third electrodes with respect to each of the four LEDs 311 are joined with one another, efficiency of a forming process of third electrodes can be improved compared to a case wherein third electrodes are separately formed with respect to each of the four LEDs 311. Further, reliability in a bonding process between the LEDs 311 and a driving substrate can be improved.

According to the various embodiments of the disclosure as described above, leakage currents that may be generated inside an LED 311 can be reduced, and at the same time, the degree of utilization of an element and efficiency of a manufacturing process in manufacturing a display device can be improved. Also, an efficient method of connecting an LED 111 and a driving substrate can be provided.

In addition, flip-chip LEDs according to embodiments of the disclosure are advantageous for miniaturization, weight reduction, and high integration, and thus can be widely used particularly in the field of micro LEDs.

While the disclosure has been shown and described with reference to non-limiting example embodiments thereof, the disclosure is not limited to the aforementioned specific embodiments, and it is apparent that various modifications can be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

What is claimed is:

1. A flip-chip light emitting diode (LED) comprising:
   a light-emitting layer;
   an n-type semiconductor layer and a p-type semiconductor layer that are on a respective one from among an upper part and a lower part of the light-emitting layer;
   a first electrode that is electrically connected to the n-type semiconductor layer via a first contact hole formed in the LED;
   a second electrode that is electrically connected to the p-type semiconductor layer, and is electrically insulated from the first electrode;
   a metal layer provided in a first area surrounding an outer contour surface of the LED, a second area where the first contact hole is formed, and a third area separate from areas where the first electrode and the second electrode are formed;
   a third electrode that is formed on the metal layer in the third area, is electrically connected to the metal layer, and is electrically insulated from the first electrode and the second electrode; and
   a plurality of insulating layers that are provided on upper and lower parts of the metal layer such that the metal layer is electrically insulated from the first electrode and the second electrode.

2. The LED of claim 1, further comprising:
   a reflective layer provided on the p-type semiconductor layer, wherein a second contact hole is formed through one of the plurality insulating layers, and the second electrode is electrically connected to the p-type semiconductor layer through the second contact hole and the reflective layer.

3. The LED of claim 1, further comprising:

a fourth electrode, wherein the metal layer is further provided in a fourth area that is separate from areas where the first electrode, the second electrode, and the third electrode are formed, and the fourth electrode is formed on the metal layer in the fourth area, is electrically connected to the metal layer, and is electrically insulated from the first electrode and the second electrode.

4. The LED of claim 3, wherein the third area, in which the third electrode is formed, is located on one side of the LED, and the fourth area, in which the fourth electrode is formed, is located on a side of the LED that is opposite to the side in which the third area is located.

5. The LED of claim 4, wherein the first electrode and the second electrode are located between the third electrode and the fourth electrode.

6. A manufacturing method of a flip-chip light emitting diode (LED) comprising:

depositing a light-emitting layer, a p-type semiconductor layer, and an n-type semiconductor layer on a substrate, the p-type semiconductor layer and the n-type semiconductor layer being on a respective one from among an upper part and a lower part of the light-emitting layer;

forming a plurality of light-emitting cells, each including the light-emitting layer, the n-type semiconductor layer, and the p-type semiconductor layer, by etching the light-emitting layer, the n-type semiconductor layer, and the p-type semiconductor layer;

forming, with respect to each of the plurality of light-emitting cells, a first contact hole in the light emitting cell by etching the light-emitting layer, the n-type semiconductor layer, and the p-type semiconductor layer;

depositing, with respect to each of the plurality of light-emitting cells, a first insulating layer on areas wherein etching was performed in the step of forming the plurality of light-emitting cells and on areas wherein etching was performed in the step of forming the first contact hole;

depositing, with respect to each of the plurality of light-emitting cells, a metal layer on a first area surrounding an outer contour surface of the light-emitting cell, a second area where the first contact hole is formed, and a third area on one side among upper areas of the first insulating layer;

depositing, with respect to each of the plurality of light-emitting cells, a second insulating layer on the second area where the first contact hole is formed;

forming, with respect to each of the plurality of light-emitting cells, a second contact hole in another side surface area separate from areas where the metal layer is deposited among the upper areas of the first insulating layer; and forming, with respect to each of the plurality of light-emitting cells, a first electrode in the first contact hole, forming a second electrode in the second contact hole, and forming a third electrode in the third area where the metal layer is deposited.

7. The manufacturing method of an LED of claim 6, further comprising:

depositing a reflective layer on the p-type semiconductor layer that is previously deposited, wherein the forming the first contact hole comprises forming, with respect to each of the plurality of light-emitting cells, the first contact hole in the light emitting cell by etching the light-emitting layer, the n-type semiconductor layer, the p-type semiconductor layer, and the reflective layer.

8. A display device comprising:

a plurality of light emitting diodes (LEDs);

a plurality of driving electrodes;

a display panel including a driving substrate; and a processor configured to control the display panel, wherein at least one LED among the plurality of LEDs is a flip-chip LED comprising:

a light-emitting layer;

an n-type semiconductor layer and a p-type semiconductor layer that are on a respective one from among an upper part and a lower part of the light-emitting layer;

a first electrode that is electrically connected to the n-type semiconductor layer via a first contact hole formed in the LED;

a second electrode that is electrically connected to the p-type semiconductor layer, and is electrically insulated from the first electrode;

a metal layer provided in a first area surrounding an outer contour surface of the flip-chip LED, a second area where the first contact hole is formed, and a third area separate from areas where the first electrode and the second electrode are formed;

a third electrode that is formed on the metal layer in the third area, is electrically connected to the metal layer, and is electrically insulated from the first electrode and the second electrode; and a plurality of insulating layers that are provided on upper and lower parts of the metal layer such that the metal layer is electrically insulated from the first electrode and the second electrode.

9. The display device of claim 8, wherein each of the at least one LED among the plurality of LEDs further comprises a reflective layer provided on the p-type semiconductor layer, wherein, for each of the at least one LED, the LED includes a second contact hole that is formed through one of the plurality of insulating layers of the LED, and for each of the at least one LED, the second electrode of the LED is electrically connected to the p-type semiconductor layer of the LED through the second contact hole of the LED and the reflective layer of the LED.

10. The display device of claim 8, wherein each of the at least one LED among the plurality of LEDs further comprises a fourth electrode, wherein, for each of the at least one LED, the metal layer of the LED is further provided in a fourth area of the LED that is separate from areas of the LED where the first electrode, the second electrode, and the third electrode are formed, and for each of the at least one LED, the fourth electrode of the LED is formed on the metal layer of the LED in the fourth area of the LED, is electrically connected to the metal layer of the LED, and is electrically insulated from the first electrode of the LED and the second electrode of the LED.

11. The display device of claim 10, further comprising:
a first element including a first LED of the at least one LED; and
a second element, adjacent to the first element, including a second LED of the at least one LED,
wherein the fourth electrode of the first LED and the fourth electrode of the second LED are electrically connected to the driving substrate through a same driving electrode of the plurality of driving electrodes, and
the third electrode of the first LED and the third electrode of the second LED are electrically connected to the driving substrate through respective driving electrodes of the plurality of driving electrodes that are different from each other.

12. The display device of claim 8, wherein
the driving substrate includes a plurality of switching elements, and
each of the plurality of switching elements is individually connected to each of the first electrode, the second electrode, and the third electrode, of an LED of the at least one LED, through the plurality of driving electrodes, and
the processor independently controls application of voltages to the first electrode, the second electrode, and the third electrode of the LED through the plurality of switching elements.

13. The display device of claim 8, wherein
the at least one LED is at least two LEDs,
the display device further comprises:
a first element including a first LED from among the at least two LEDs; and
a second element, adjacent to the first element, including a second LED from among the at least two LEDs, and
the third electrode of the first LED and the third electrode of the second LED are electrically connected to the driving substrate through a same driving electrode of the plurality of driving electrodes.

14. The display device of claim 13, wherein
the at least two LEDs is at least three LEDs, and
the third electrode of a third LED from among the at least three LEDs is electrically connected to the driving substrate through the same driving electrode in which the third electrode of the first LED and the third electrode of the second LED are connected to the driving substrate through.

15. The display device of claim 14, wherein
the first LED, the second LED, and the third LED, each constitute a different colored sub-pixel.

16. The display device of claim 15, wherein
the first LED constitutes a red sub-pixel, the second LED constitutes a green sub-pixel, and the third LED constitutes a blue sub-pixel.

17. The display device of claim 8, wherein
the at least one LED is at least two LEDs,
the display device further comprises:
a first element including a first LED from among the at least two LEDs; and
a second element, adjacent to the first element, including a second LED from among the at least two LEDs, and
the third electrode of the first LED and the third electrode of the second LED are joined with each other in the display panel.

18. The display device of claim 17, wherein
the at least one electrode includes a third LED and a fourth LED that are adjacent to the first LED and the second LED,
the third electrode of the third LED and the third electrode of the fourth LED are joined with the third electrode of the first LED and the third electrode of the second LED, that are joined, and
the first LED, the second LED, the third LED, and the fourth LED, together, constitute a pixel.

19. The display device of claim 8, wherein
the display panel further comprises:
a plurality of phosphors provided on upper parts of the plurality of LEDs; and
a plurality of light-leakage blocking films provided among the plurality of phosphors, and
light-emitting areas of each of the plurality of LEDs are separated in parallel through the plurality of light-leakage blocking films.

20. The display device of claim 19, wherein
the plurality of phosphors comprises quantum dots (QDs).

* * * * *